United States Patent [19]
Gilgen et al.

[11] Patent Number: 5,134,085
[45] Date of Patent: Jul. 28, 1992

[54] REDUCED-MASK, SPLIT-POLYSILICON CMOS PROCESS, INCORPORATING STACKED-CAPACITOR CELLS, FOR FABRICATING MULTI-MEGABIT DYNAMIC RANDOM ACCESS MEMORIES

[75] Inventors: Brent D. Gilgen; Tyler A. Lowrey; Joseph J. Karniewicz; Anthony M. McQueen, all of Boise, Id.

[73] Assignee: Micron Technology, Inc., Boise, Id.

[21] Appl. No.: 796,099

[22] Filed: Nov. 21, 1991

[51] Int. Cl.[5] ............................................. H01L 21/70
[52] U.S. Cl. ...................................... 437/52; 437/47; 437/48; 437/57; 437/60; 437/228; 437/919; 357/23.6
[58] Field of Search ...................... 437/47, 48, 52, 60, 437/228, 233, 235, 919, 56, 57, 59, 34; 357/23.6, 51

[56] References Cited

U.S. PATENT DOCUMENTS

| | | | |
|---|---|---|---|
| 4,855,801 | 8/1989 | Kueslers | 437/52 |
| 4,910,566 | 3/1990 | Ema | 437/51 |
| 4,987,089 | 1/1991 | Roberts et al. | 437/34 |
| 5,021,353 | 6/1991 | Lowrey et al. | 437/34 |
| 5,023,190 | 6/1991 | Lee et al. | 437/56 |
| 5,026,657 | 6/1991 | Lee et al. | 437/34 |
| 5,030,585 | 7/1991 | Gonzalez et al. | 437/34 |
| 5,032,530 | 7/1991 | Lowrey et al. | 437/34 |
| 5,071,783 | 10/1991 | Taguchi et al. | 437/919 |

FOREIGN PATENT DOCUMENTS 57-17164 1/1982 Japan .

Primary Examiner—Tom Thomas
Attorney, Agent, or Firm—Angus C. Fox, III

[57] ABSTRACT

This invention constitutes a 10–12 mask, split-polysilicon process for fabricating dynamic random access memories of the stacked capacitor type for the one-megabit generation and beyond. The process flow is characterized: reduced mask count due to the elimination of the N+ and p+ source-drain masking layers via the split polysilicon technique; an option to further reduce wafer processing by allowing the LOCOS stress relief (pad) oxide layer to later function as the transistor gate dielectric layer; N-channel device optimization via self-aligned punch-through and lightly-doped-drain (LDD) implants, without the addition of extra P-channel masking steps via the split poly approach; use of semi, self-aligned contact of bottom cell plate to access gate diffusion allowing tight spacing between bottom cell plate buried contact and access gate polysilicon; improved refresh characteristics achieved by avoiding reduction of isolation thickness due to the spacer oxide etch; improved refresh characteristics achieved by protecting the sensitive areas of the storage node from damage typically caused by a spacer oxide etch; improved refresh characteristics achieved by eliminating the high-dose N-channel source/drain implantation from the storage node side of the access transistor gate; and improved immunity to soft error upset achieved through the use of an optional self-aligned "Hi-C" implant that is performed without the addition of an extra masking step.

23 Claims, 20 Drawing Sheets ced-mask, split-polysilicon cmos
process, incorporating
stacked-capacitor cells, for
fabricating multi-megabit dynamic
random access memories

FIELD OF THE INVENTION

This invention relates to integrated circuit manufacturing technology and, more specifically, to low-cost processes utilizing a reduced number of mask sets, for manufacturing CMOS dynamic random access memories of stacked cell capacitor design.

BACKGROUND OF THE INVENTION

Most current-generation dynamic random access memories (DRAMs) utilize CMOS technology. Although the term "CMOS" is an acronym for (C)omplementary (M)etal (O)xide (S)emiconductor, the term CMOS is now more loosely applied to any integrated circuit in which both N-channel and P-channel field-effect transistors are used in a complementary fashion. Although CMOS integrated circuit devices are often referred to as "semiconductor" devices, such devices are fabricated from various materials which are either electrically conductive, electrically nonconductive or electrically semiconductive. Silicon, the most commonly used semiconductor material can be made conductive by doping it (introducing an impurity into the silicon crystal structure) with either an element such as boron which has one less valence electron than silicon, or with an element such as phosphorus or arsenic which have one more valence electron than silicon. In the case of boron doping, electron "holes" become the charge carriers and the doped silicon is referred to as positive or P-type silicon. In the case of phosphorus or arsenic doping, the additional electrons become the charge carriers and the doped silicon is referred to as negative or N-type silicon If a mixture of dopants having opposite conductivity types is used, counter doping will result, and the conductivity type of the most abundant impurity will prevail. Silicon is used either in single-crystal or polycrystalline form. Polycrystalline silicon is referred to hereinafter as "polysilicon" or simply as "poly". Although polysilicon has largely replaced metal for the MOS device gates, the inherently high conductivity of a metal has led many semiconductor manufacturers to create a layer of refractory metal silicide on transistor gates in order to increase device speed.

CMOS processes begin with a lightly-doped P-type or N-type silicon substrate, or lightly-doped epitaxial silicon on a heavily doped substrate. For the sake of simplicity, the prior art CMOS process will be described using P-type silicon as the starting material. If N-type silicon were used, the process steps would be virtually identical, with the exception that in some cases, dopant types would be reversed.

In 1982, Japanese patent number 57-17164 was issued to Masahide Ogawa. This patent teaches the fabrication of a CMOS integrated circuit by processing N-channel and P-channel devices separately. As with conventional CMOS processes, a single polysilicon layer is used to form both N-channel and P-channel gates. However, N-channel devices are formed first, with unetched polysilicon left in the future P-channel regions until N-channel processing is complete. The mask used to subsequently pattern the P-channel devices is also used to blanket and protect the already-formed N-channel devices. This process is herein referred to as the split-polysilicon CMOS process. The split-polysilicon CMOS process, though largely ignored by semiconductor manufacturers in the U.S. and abroad, has been used extensively by Micron Technology, Inc. of Boise, Idaho as a means to reduce the mask sets and, hence, the cost of manufacturing dynamic random access memories.

The memory cells of dynamic random access memories are comprised of two main components: a field-effect transistor and a capacitor. In DRAM cells utilizing a conventional planar capacitor, far more chip surface area is dedicated to the planar capacitor than to the field-effect transistor (FET). Wordlines are generally etched from a polysilicon-1 layer. A doped region of silicon substrate functions as the lower (storage-node) capacitor plate, while a doped polysilicon-2 layer generally functions as the upper capacitor plate (cell plate). Although planar capacitors have generally proven adequate for use in DRAM chips up to the one-megabit level, they are considered to be unusable for more advanced DRAM generations. As component density in memory chips has increased, the shrinkage of cell capacitor size has resulted in a number of problems. Firstly, the alpha-particle component of normal background radiation can generate hole-electron pairs in the silicon substrate, which can be collected by the lower capacitor plate. This phenomena will cause a charge stored within the affected cell capacitor to rapidly dissipate, resulting in a "soft" error. Secondly, the sense-amplifier differential signal is reduced. This aggravates noise sensitivity and makes it more difficult to design column sense-amplifiers having appropriate signal selectivity. Thirdly, as cell capacitor size is decreased, the smaller charge stored within the cell leaks to an unusable level sooner, which necessitates more frequent interruptions for refresh overhead. The difficult goal of a DRAM technologist is therefore to increase or, at least, maintain cell capacitance as cell size shrinks, without resorting to processes that reduce product yield or that markedly increase the number of masking, deposition, etch, implant, sputter, and other steps in the production process.

As a result of the problems associated with the use of planar capacitors for high-density DRAM memories, all manufacturers of 4-megabit DRAMs are utilizing cell designs based on non-planar capacitors. Two basic non-planar capacitor designs are currently in use: the trench capacitor, and the stacked capacitor. Both types of non-planar capacitors typically require a considerably greater number of masking, deposition and etching steps for their manufacture than does a planar capacitor.

In a trench capacitor, charge is stored primarily vertically, as opposed to horizontally in a planar capacitor. Since trench capacitors are fabricated in trenches which are etched in the substrate, some trench capacitor structures can be susceptible to soft errors. In addition, there are several other problems inherent in the trench design. One problem is that of trench-to-trench charge leakage, caused by the parasitic transistor effect between adjacent trenches. Another problem is cell storage node-to-substrate leakage attributable to single crystal defects which are induced by stress associated with the trench structure. Yet Another problem is the difficulty of completely cleaning the trenches during the fabrication process; failure to completely clean a trench will generally result in a defective cell.

The stacked capacitor design, on the other hand, has proven somewhat more reliable and easier to fabricate than the trench design. Consequently, most manufacturers of 4-megabit DRAMs are utilizing stacked capacitor designs. Since both the lower and the upper plates of a typical stacked capacitor are formed from individual conductive layers, the stacked capacitor is generally much less susceptible to soft errors than either the planar or trench capacitors. By placing the wordline and, in some designs, also the bitline beneath the capacitive layers, and having the lower layer make contact with the substrate by means of a buried contact, some manufacturers have created stacked capacitor designs in which vertical portions of the capacitor contribute significantly to the total charge storing capacity. Since a stacked capacitor generally covers not only the entire area of a cell (including the cell's access FET), but adjacent field oxide regions as well, capacitance is considerably enhanced over that available from a planar type cell.

The business of producing CMOS semiconductor devices is a very competitive, high-volume business. Process efficiency and manufacturability, as well as product quality, reliability, and performance are the key factor that determine the economic success of such a venture. Each new generation of CMOS devices generally has an integration level that is four times that of the generation which it replaced. Such a quadrupling of device number per chip is usually accompanied by a decrease in device geometries. As device geometries shrink, each photolithographic step becomes more costly. The increase in cost may be attributed to a number of factors, including:

(a) higher capital costs for precision "state-of-the-art" photolithographic equipment;

(b) an increase in the number of processing steps for each mask level, which slows the fabrication process and requires additional expensive equipment;

(c) the requirement for ultra-clean fabrication facilities which are both expensive to construct and expensive to operate;

(d) greater investment per wafer during fabrication, which increases the cost of scrapping defective devices; and (e) costs associated with the step required subsequent to the masking step, whether it be an implant or an etch.

Triple polysilicon layer manufacturing processes for contemporary stacked-capacitor dynamic random access memories require some fourteen to eighteen masking steps. In light of the costs associated with masking operations, a manufacturing process which requires a dramatically-reduced number of masking operations would be greatly preferred.

SUMMARY OF THE INVENTION

This invention constitutes a 10-12 mask split-polysilicon process for fabricating dynamic random access memories of the stacked capacitor type for the one megabit generation and beyond. The process flow is characterized by a number of advantages over those which are in general use in the industry. Those advantages include:

(a) reduced mask count due to the elimination of the N+ and P+ source-drain masking layers via the split polysilicon technique;

(b) an option to further reduce wafer processing by allowing the LOCOS stress relief (pad) oxide layer to later function as the transistor gate dielectric layer;

(c) N-channel device optimization via self-aligned punch-through and lightly-doped-drain (LDD) implants, without the addition of extra P-channel masking steps via the split poly approach;

(d) use of semi, self-aligned contact of bottom cell plate to access gate diffusion allowing tight spacing between bottom cell plate buried contact and access gate polysilicon;

(e) improved refresh characteristics achieved by avoiding reduction of isolation oxide thickness due to the spacer oxide etch;

(f) improved refresh characteristics achieved by protecting the sensitive areas of the storage node from damage typically caused by a spacer oxide etch;

(g) improved refresh characteristics achieved by eliminating the high-dose N-channel source/drain implantation from the storage node side of the access transistor gate; and (h) improved immunity to soft error upset achieved through the use of a self-aligned "Hi-C" implant performed without the addition of extra masking steps.

PREFERRED EMBODIMENT OF THE INVENTION

Figure 1:
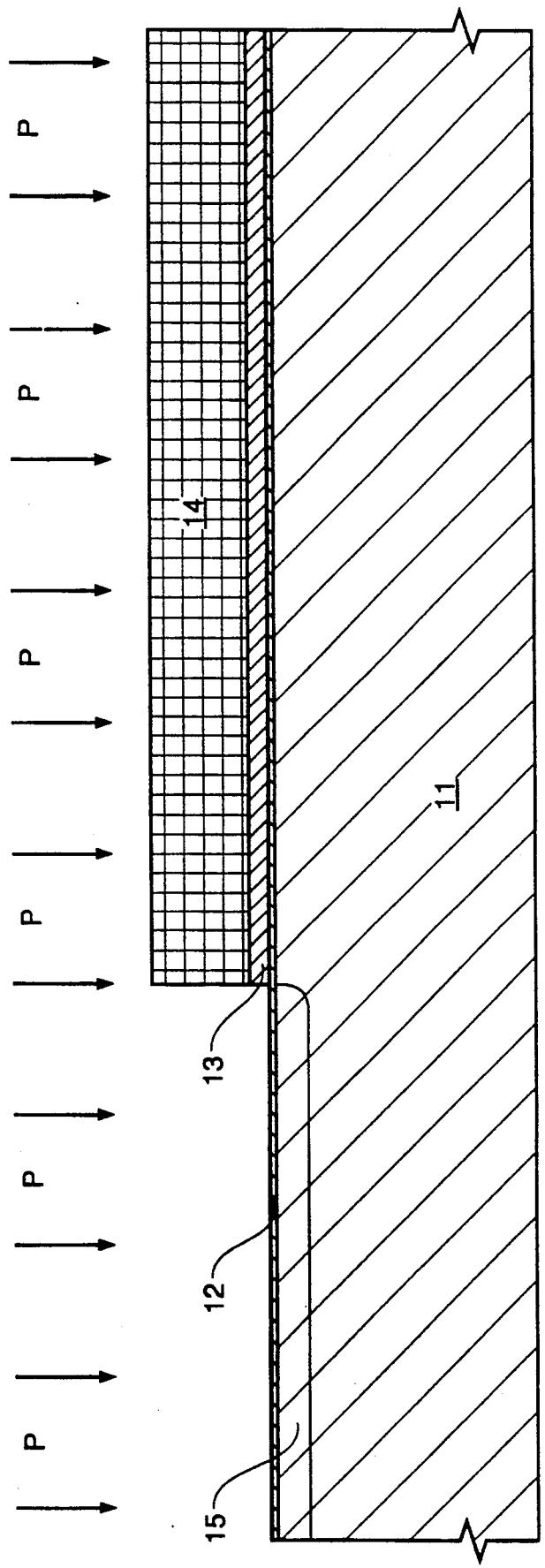
FIG. 1 is a cross-sectional view of a portion of a semiconductor wafer consisting of a lightly-doped P-type monocrystalline silicon substrate that has been subjected to an oxidation step, a silicon nitride deposition step, a first photomasking step, and a subsequent nitride etch step, and a phosphorus N-well implant.

Referring now to FIG. 1, a semiconductor wafer consisting of a lightly-doped P-type monocrystalline silicon substrate 11 has been subjected to a thermal oxidation step, which has created a first pad oxide layer 12, and a deposition step, which resulted in a first silicon nitride layer 13. A first photoresist mask (also photomask) 14 was then created on top of first nitride layer 13, said mask 14 exposing regions of first nitride layer 13 that are superjacent regions of the substrate that are to be converted to N-well regions. Following a nitride etch, which has removed portions of first nitride layer 13 superjacent the future N-well regions, the wafer is subjected to a phosphorus N-well implant, which has created (in this particular representation) N-well region 15. It should be noted that the drawings are composite representations of a memory cell having an N-channel access transistor shown in close proximity to a P-channel peripheral transistor. The figures are not meant to be actual cross-sectional views of any particular portion of a real DRAM memory, but are merely convenient tools employed to more fully depict the process at various stages of manufacture.

Figure 2:
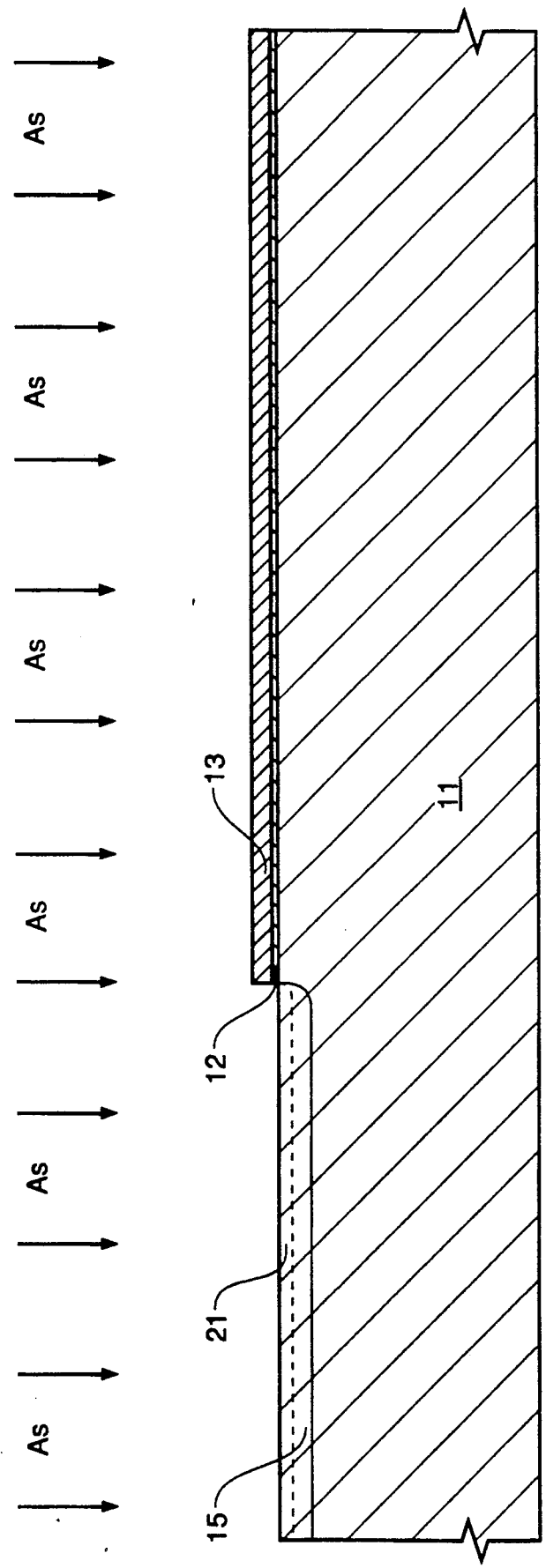
FIG. 2 is a cross-sectional view of the wafer portion of FIG. 1 following a photoresist strip, a wet oxide etch, and an optional arsenic N-well implant.

Referring now to FIG. 2, photoresist mask 14 has been stripped, and a wet oxide etch has removed that portion of first pad oxide layer 12 that is not covered by the remnants of first nitride layer 13. The wafer is then subjected to an arsenic implant, which creates a shallow arsenic implanted layer 21 within N-well 15. Arsenic atoms are blocked from penetrating the substrate where the wafer is covered by the remnants of first nitride layer 13.

Figure 3:
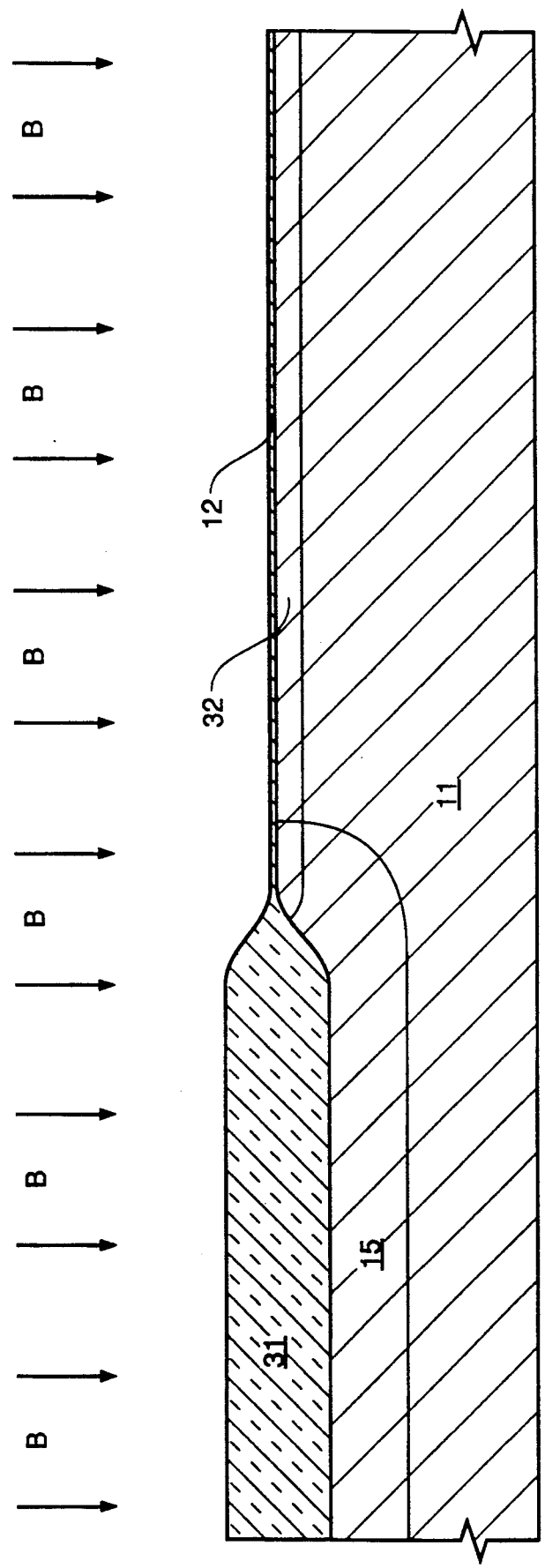
FIG. 3 is a cross-sectional view of the wafer portion of FIG. 2 following an oxidation step at elevated temperature, an oxide etch, a nitride etch, and a boron P-well implant.

Referring now to FIG. 3, the wafer is subjected to a first steam oxidation step (preferably in the presence of steam) at elevated temperature, which oxidizes the surface of N-well region 15 to create protective oxide layer 31, and drives the implanted phosphorus and arsenic atoms deeper into the substrate. Following the steam oxidation step, the wafer is subjected to a wet oxide etch, which removes any oxide on the surface of first nitride layer 13, and a subsequent wet nitride etch, which removes the remnants of first nitride layer 13. The wafer is then subjected to a boron implant, which penetrates N-well protective oxide layer 31 (but not the N-well itself) and creates P-well regions 32 in substrate 11.

Figure 4:
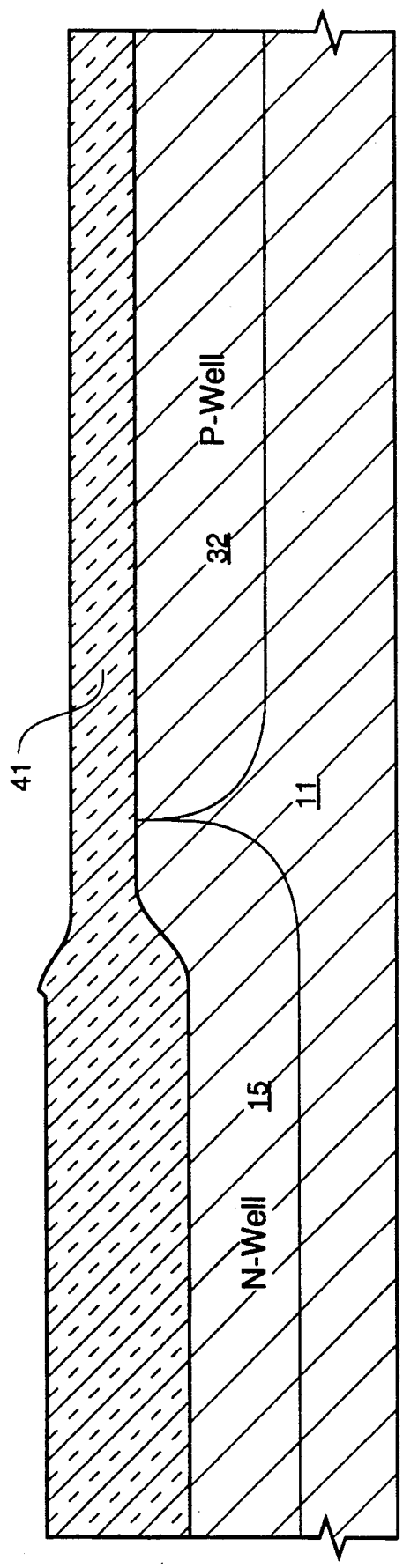
FIG. 4 is a cross-sectional view of the wafer portion of FIG. 3 following a second oxidation step.

Referring now to FIG. 4, the wafer is subjected to a second oxidation step (again, preferably in the presence of steam) creates a blanket oxide layer 41 on top of the P-well regions, which assists in the diffusion of the implanted boron atoms into the substrate within P-well region 32.

Figure 5:
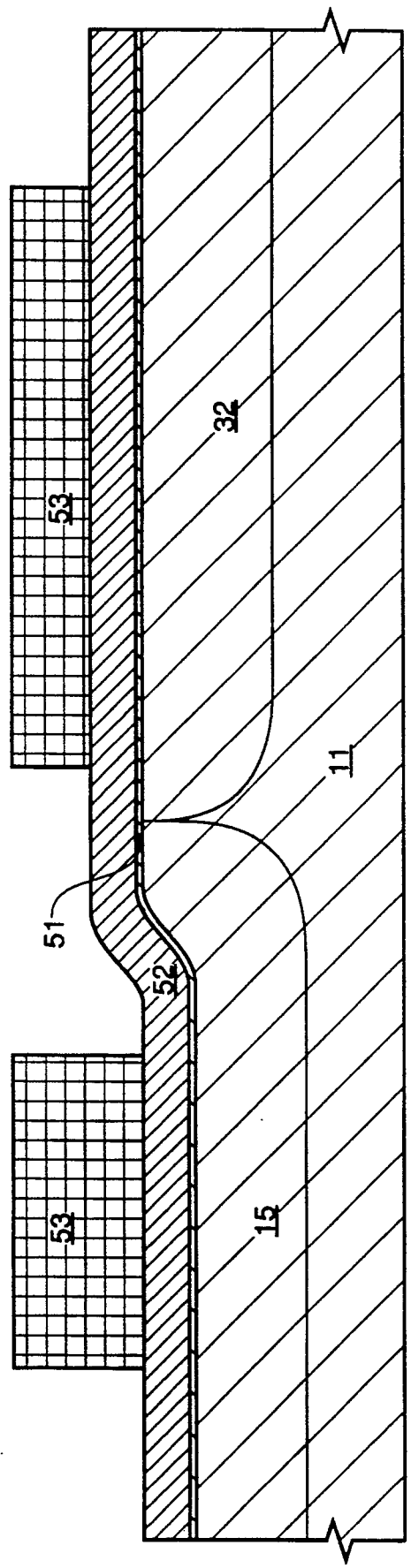
FIG. 5 is a cross-sectional view of the wafer portion of FIG. 4 following an oxide etch, thermal oxide growth, a silicon nitride deposition step, and a second photomasking step.

Referring now to FIG. 5, following a wet oxide etch that has removed protective oxide layer 31 and blanket oxide layer 41, a second pad oxide layer 51 is grown over the surface of the wafer. The wafer is then subjected to a deposition step in order to create second silicon nitride layer 52. A second photoresist mask 53 is then created on top of second nitride layer 52, with future active areas covered by photoresist and future field oxide regions exposed.

Figure 6:
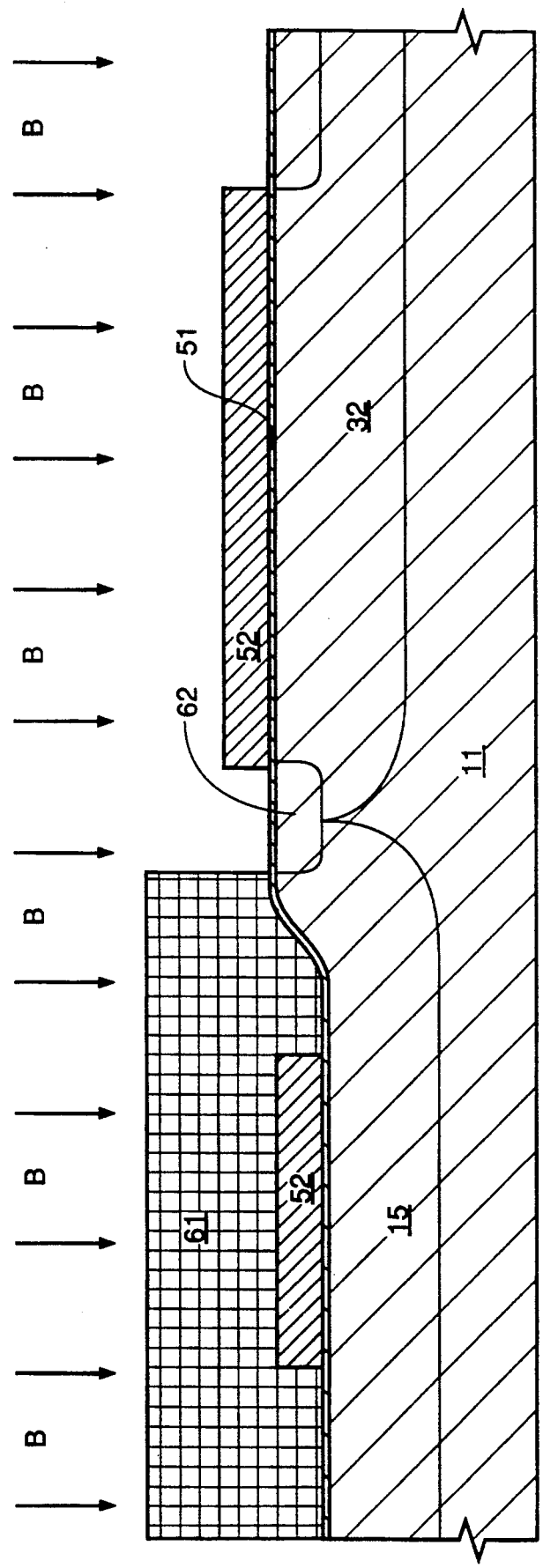
FIG. 6 is a cross-sectional view of the wafer portion of FIG. 5 following a dry nitride etch, a photoresist strip, an optional third photomasking step, and a boron field implant.

Referring now to FIG. 6, a dry nitride etch has left remnants of nitride layer 52 on top of the future active areas, after which second photoresist mask 53 is stripped and an optional third photoresist mask 61 is created, which masks N-well region 15. A boron field implant (also known as a channel-stop implant) is then performed, creating a boron-implanted region 62 in future field oxide regions adjacent P-well region 32, which will improve device isolation.

Figure 7:
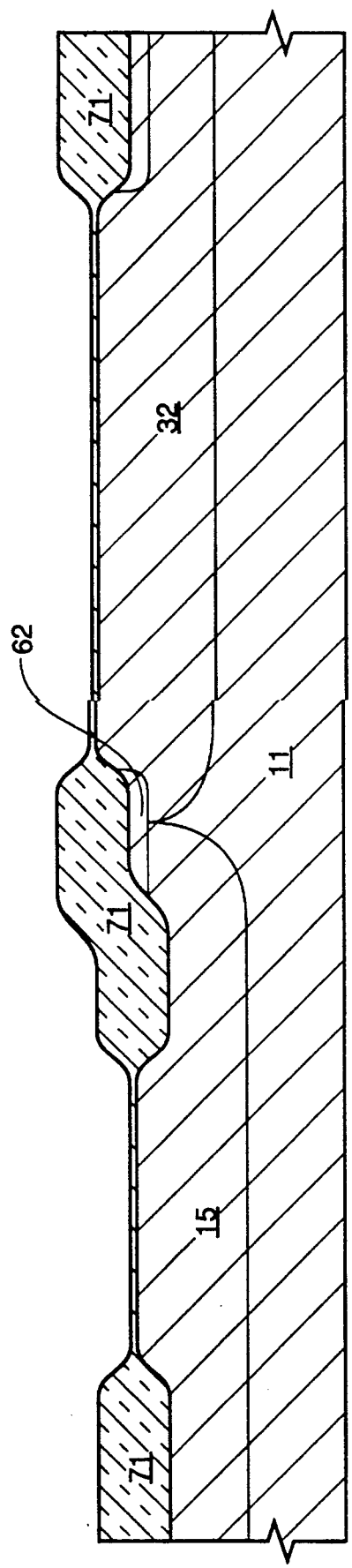
FIG. 7 is a cross-sectional view of the wafer portion of FIG. 6 following a photoresist strip, a field oxidation step, an oxide strip, and a subsequent silicon nitride etch.

Referring now to FIG. 7, third photoresist mask 61 has been stripped, the wafer has been subjected to an oxidation step, which creates field oxide regions (also referred to herein as device isolation regions) 71, after which a wet oxide etch removes any silicon dioxide on the upper surface of the remnants of second nitride layer 52, and a wet silicon nitride etch completely removes those remnants of nitride layer 52.

Figure 8:
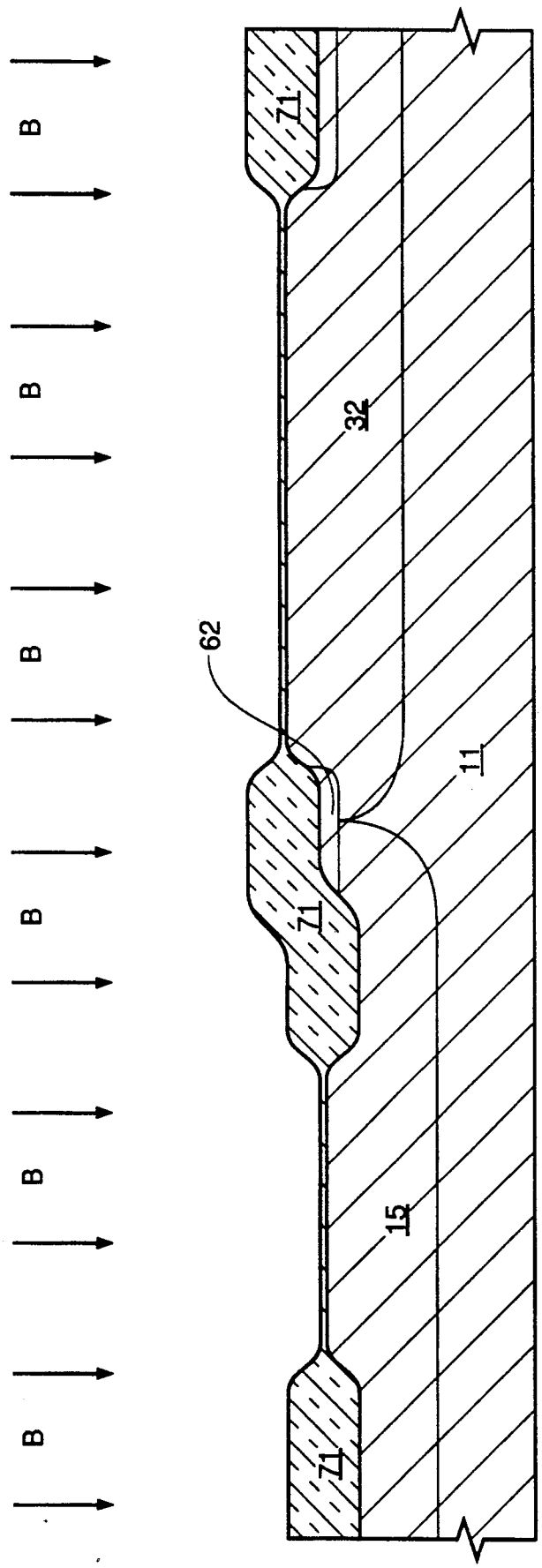
FIG. 8 is a cross-sectional view of the wafer portion of FIG. 7 following an optional fourth photomasking step and a boron threshold voltage enhancement implant.

Referring now to FIG. 8, if the design requires multiple N-channel or P-channel device thresholds, a fourth photoresist mask (not shown) is used to protect natural devices (i.e. those which will not benefit from threshold voltage adjustment) from a threshold voltage enhancement implant to which the wafer is subjected at this stage of the manufacturing process.

Figure 9:
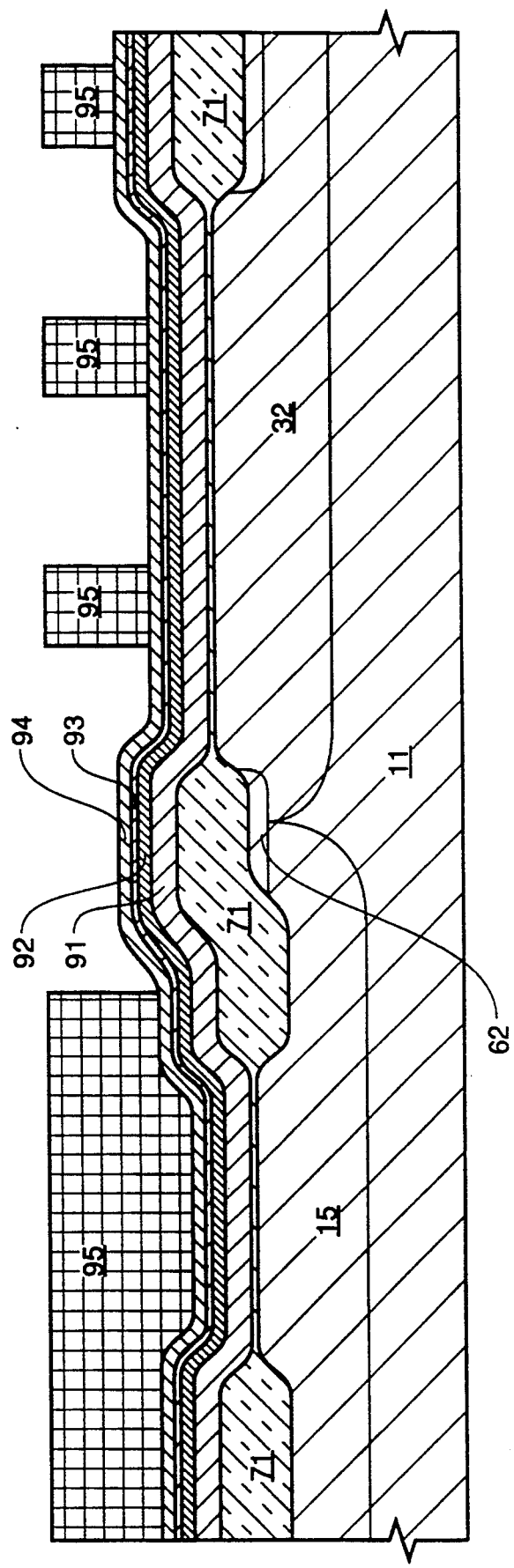
FIG. 9 is a cross-sectional view of the wafer portion of FIG. 8 following a photoresist strip, blanket deposition of a first polycrystalline silicon (poly) layer, doping of the first poly layer, creation of a refractory metal silicide layer on top of first poly layer, deposition of a silicon dioxide capping layer on top of the silicide layer, deposition of a silicon nitride capping layer on top of the oxide capping layer 93, and a fifth photomasking step.

Referring now to FIG. 9, the fourth photomask has been stripped, and a first polycrystalline silicon (poly) layer 91 has been blanket deposited over the surface of the wafer. First polysilicon layer 91 is then doped with phosphorus to render it electrically conductive. A refractory metal silicide layer 92 is then created on top of first poly layer 91 in order to reduce its sheet resistance. This bilayer structure is also referred to herein as the first conductive layer. This is accomplished using one of several well-known techniques, such as depositing a refractory metal silicide layer directly, or depositing a refractory metal (e.g. tungsten, titanium, or cobalt) layer on top of first poly layer 91 and, then, annealing so that it reacts with the underlying polysilicon to form the silicide. In order to prevent the refractory metal silicide layer from separating from the first poly layer 91 during elevated temperature cycles, an optional silicon dioxide capping layer 93 is deposited on top of silicide layer 92, following which an optional silicon nitride capping layer 94 is deposited on top of oxide capping layer 93. A fifth photoresist mask 95, which defines N-channel devices gates and interconnects is then created.

Figure 10:
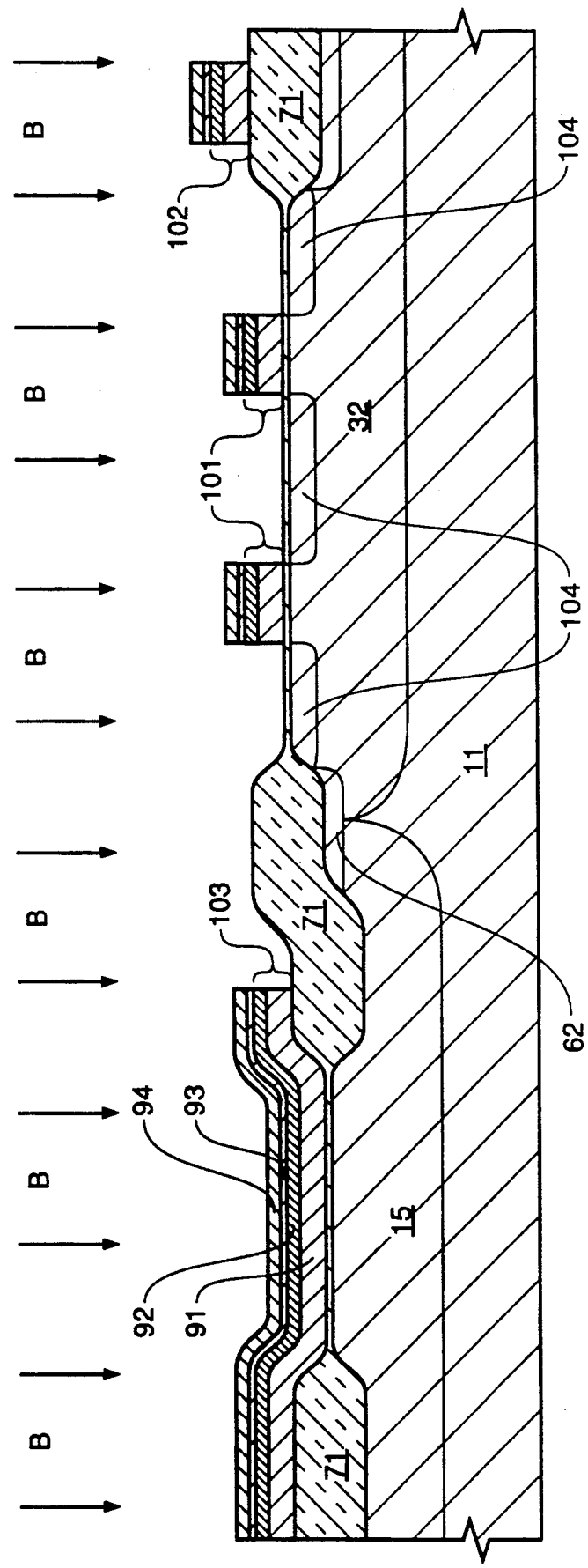
FIG. 10 is a cross-sectional view of the wafer portion of FIG. 9 following a dry etch, a photoresist strip, and an unmasked boron halo implant.

Referring now to FIG. 10, a dry etch is employed to create the N-channel gates 101 and interconnects 102 and leave an unetched expanse of dielectric-coated, silicided poly 103 in the P-channel regions which will be patterned later, following which fifth photomask 95 is stripped and an optional unmasked boron halo implant, which creates halo regions 104, is performed. This implant improves short-channel leakage characteristics by preventing low-voltage punch through.

Figure 11:
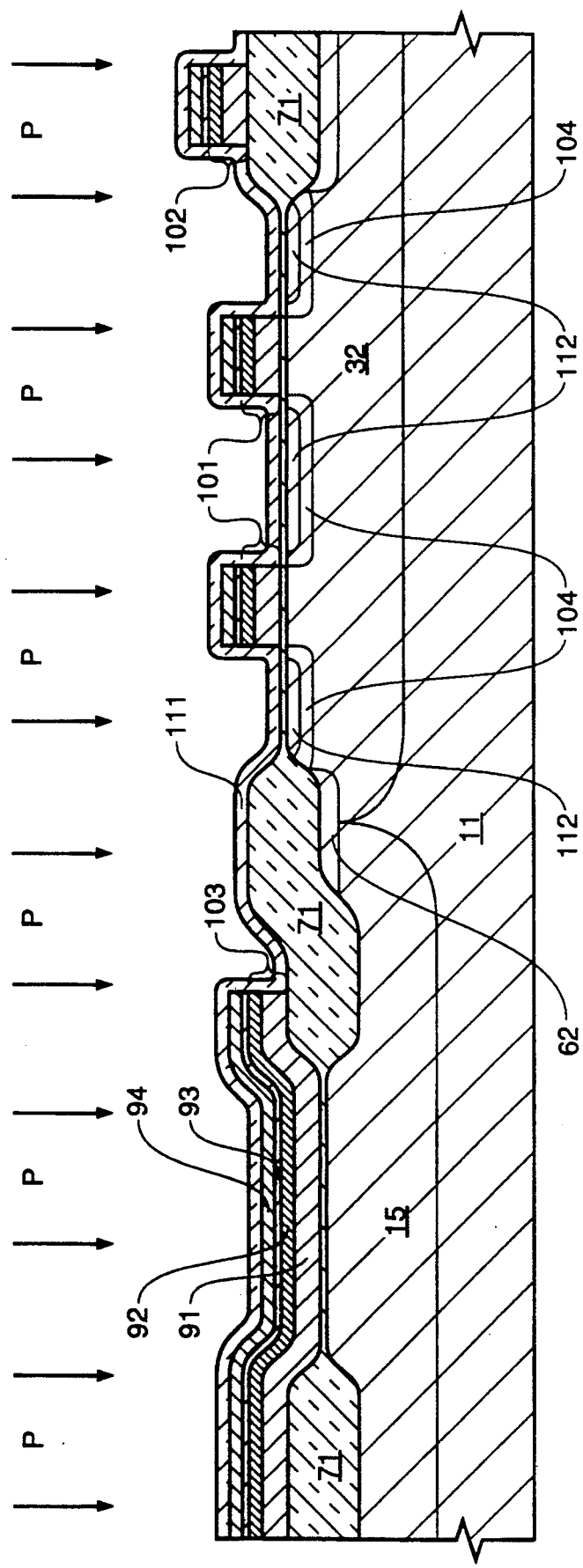
FIG. 11 is a cross-sectional view of the wafer portion of FIG. 10 following the deposition of a first silicon dioxide spacer layer, an unmasked phosphorus source/drain implant, and an optional thermal drive step.

Referring now to FIG. 11, a first silicon dioxide spacer layer 111 is blanket deposited over the wafer surface. This is followed by an optional unmasked phosphorus source/drain implant, which creates lightly-doped source/drain (LDD) regions 112. The phosphorus atoms are implanted through the horizontal portions of first silicon dioxide spacer layer 111, while the vertical portions of first spacer layer 111 spaces the phosphorus source/drain implant away from the edges of the N-channel gates, which tends to reduce the device overlap capacitance resulting in improved speed characteristics. The purpose of the phosphorus source/drain implant is to increase the source-drain series resistance of the device, thus lowering critical electrical fields and improving device reliability by reducing hot carrier injection. If the memory is to operate at low voltages (e.g., $V_{cc}=3$ volts), LDD transistor design is no longer essential, and the phosphorus source/drain implant may be omitted. Once the above implant is complete, a thermal drive step is performed to insure adequate overlap between the N-type implant and the polysilicon gate.

Figure 12:
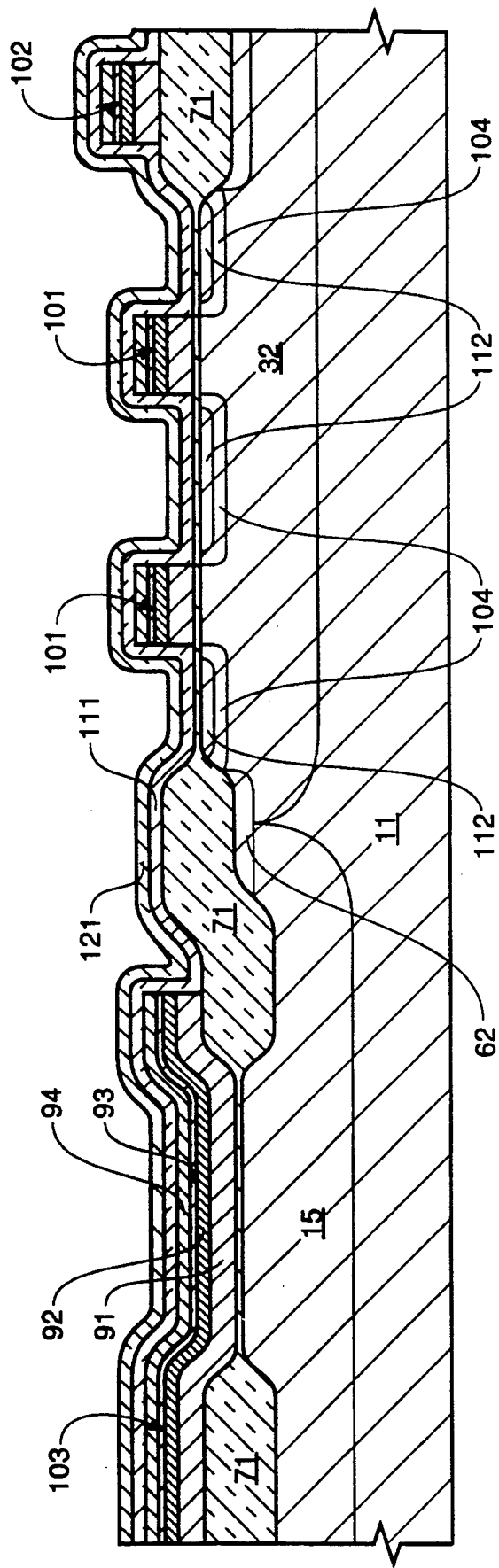
FIG. 12 is a cross-sectional view of the wafer portion of FIG. 11 following the deposition of a second silicon dioxide spacer layer, and an optional oxide densification step.

Referring now to FIG. 12, a second silicon dioxide spacer layer 121 is blanket deposited over the wafer surface. It should be noted that first silicon dioxide spacer layer 111 and second silicon dioxide spacer layer 121 are also referred to herein as first dielectric spacer layer and second dielectric spacer layer, respectively. An optional densification step follows, which compacts the material in both oxide spacer layers (in succeeding drawing figures, layers 111 and 121 will be referred to collectively as layer 131). In addition, the combined oxide films result in a thickness suitable for forming the LDD spacer required for the subsequent offset of the N-channel source/drain implant from the gate edge thus resulting in improved reliability and lower overlap capacitance.

Figure 13:
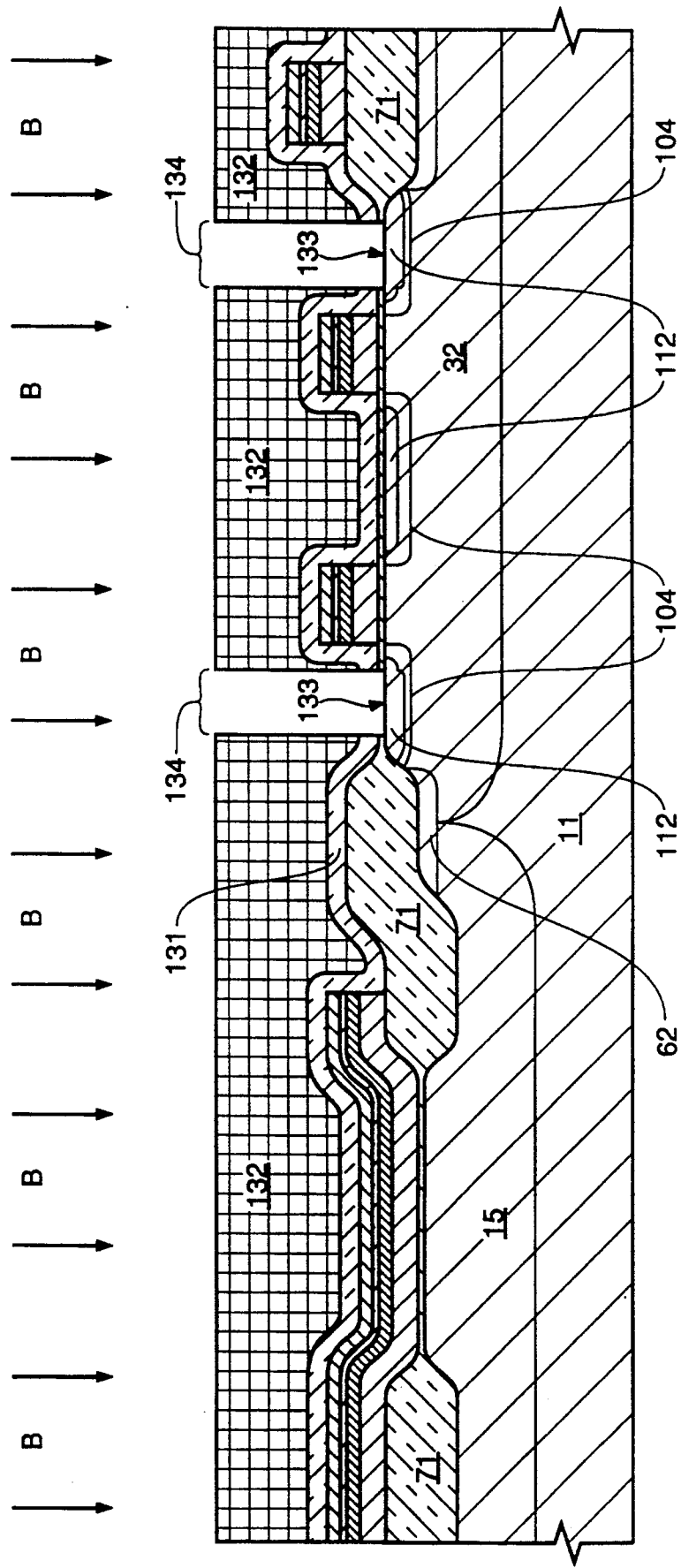
FIG. 13 is a cross-sectional view of the wafer portion of FIG. 12 following a sixth photomasking step, an anisotropic plasma etch to open up storage-node contact locations, and an optional "Hi-C" boron implant with the sixth photomask in place.

Referring now to FIG. 13, a sixth photoresist mask 132 is created which defines storage-node contact locations within the array. An anisotropic plasma etch through oxide spacer layer 131 exposes storage-node contact locations 133. The thickness of oxide spacer layer 131 will automatically limit the degree of dopant diffusion from the yet to be deposited second polysilicon layer which will serve as the bottom (storage-node) capacitor plate. This limiting function is independent of the degree of misalignment of the sixth (contact) photomask 132 with respect to the polysilicon gate and is directly related to the combined thickness of the two oxide spacer films. A "Hi-C" boron implant follows with sixth photomask 132 in place. The Hi-C implant, which is self aligned to contact opening 134 in sixth photomask 132, is performed in order to enhance immunity of the cell capacitors to alpha-particle-radiation-induced soft errors by creating an electric field below the cell. This electric field tends to reflect stray electrons created by alpha-particle hits away from the critical cell region.

Figure 14:
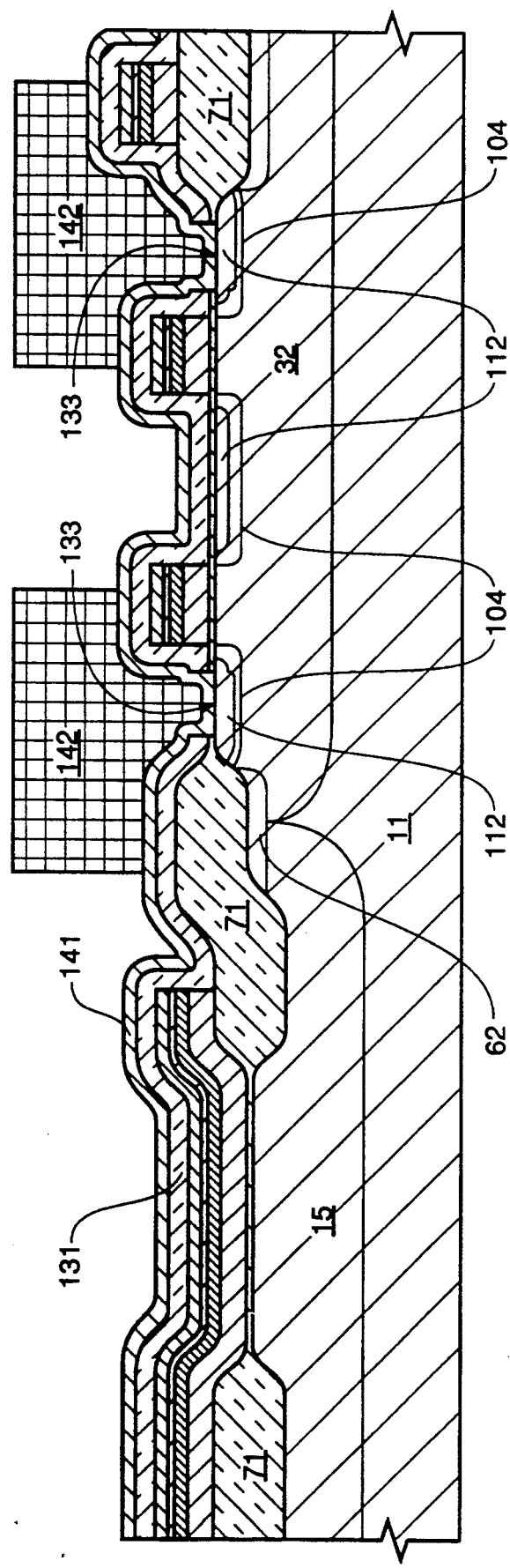
FIG. 14 is a cross-sectional view of the wafer portion of FIG. 13 following a photoresist strip, blanket deposition of a second poly layer, doping of the second poly layer, and a seventh photomasking step.

Referring now to FIG. 14, following the removal of sixth photomask 132, a second polysilicon layer 141 is blanket deposited over the surface of the wafer. Second polysilicon layer 141 is then doped (preferably with phosphorus) to render it electrically conductive, and then patterned with a seventh photoresist mask 142, which defines individual storage-node capacitor plates.

Figure 15:
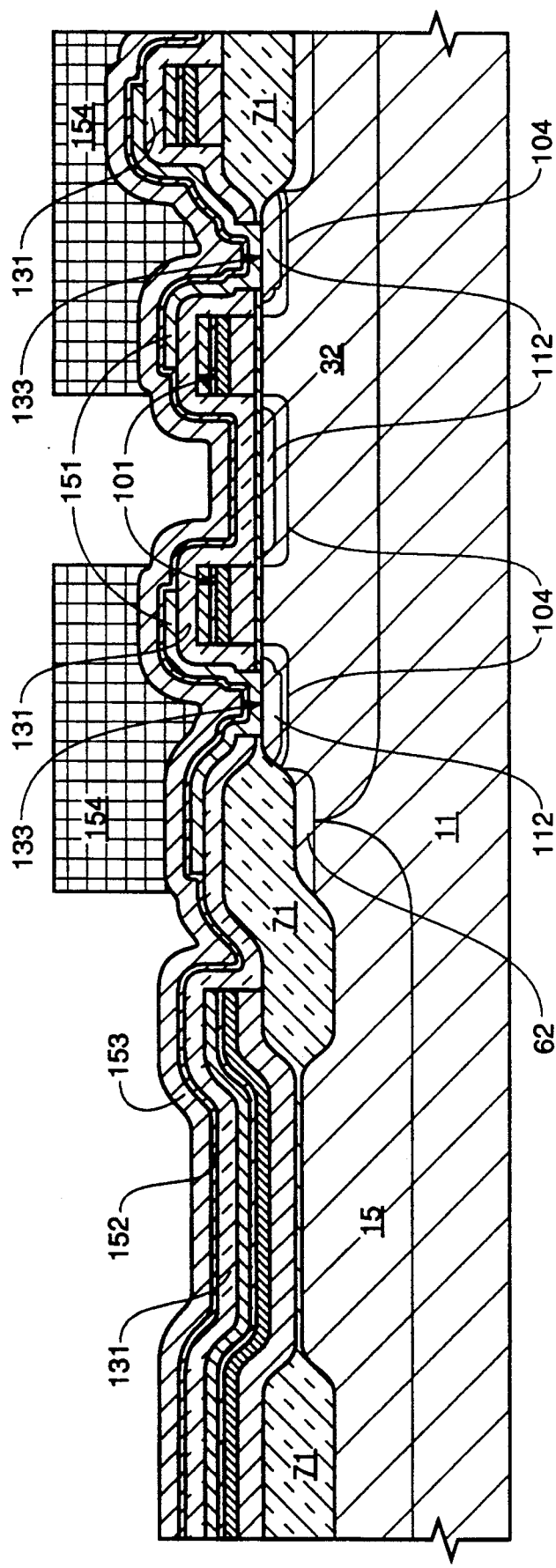
FIG. 15 is a cross-sectional view of the wafer portion of FIG. 14 following a an anisotropic plasma etch, a photoresist strip, deposition of a capacitor dielectric layer, blanket deposition of a third poly layer, and an eighth photomasking step.

Referring now to FIG. 15 second polysilicon layer 141 has been anisotropically etched in a plasma reactor to create individual storage-node capacitor plates 151, and seventh photomask 142 has been stripped. Each storage-node capacitor plate 151 contacts the underlying substrate in contact location 133. Cell capacitance is maximized by creating a stacked-capacitor design (i.e., allowing each storage-node capacitor plate 151 to overlap an access gates 101 and a field oxide region 71). It will be noted that storage-node capacitor plate 151 is insulated from gate 101 by spacer oxide layer 131, which was created by a pair of earlier oxide depositions. Once the storage-node plate 151 has been created, a capacitor dielectric layer 152 is deposited or grown on the upper surface thereof. A third polysilicon layer 153 is then deposited, doped to render it conductive, and patterned with an eighth photoresist mask 154.

Figure 16:
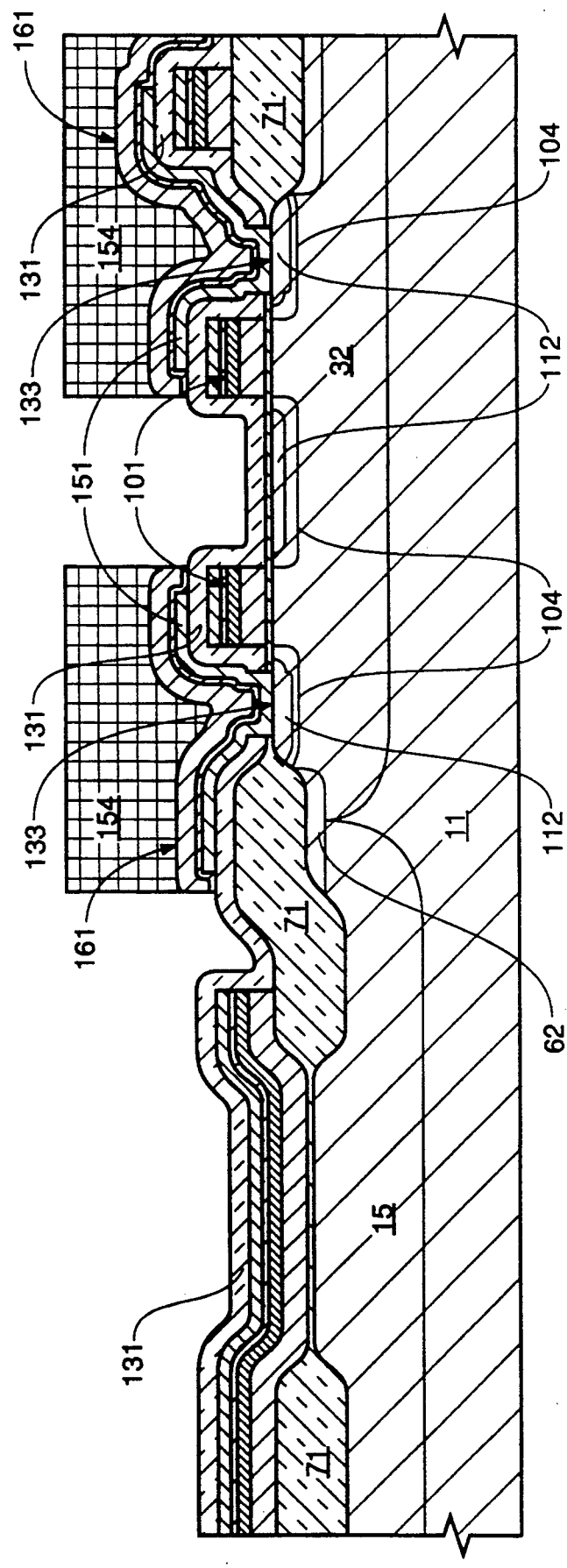
FIG. 16 is a cross-sectional view of the wafer portion of FIG. 15 following an etch of the third polysilicon layer.

Referring now to FIG. 16, third polysilicon layer 153 has been etched, with the remnants thereof forming the upper capacitor plate 161 of each cell. This cell plate 161 is common to all cells within the array, having been patterned in such a way that it completely covers all cell areas except for those regions which are opened to allow the eventual formation of a digit line contact to the underlying silicon on the side of the access gate opposite that of the capacitor cell. The cell plate 161 (i.e., the third polysilicon layer remnant) has loose registration and line width constraints so that it may be wet etched to reduce cost and improve throughput.

Figure 17:
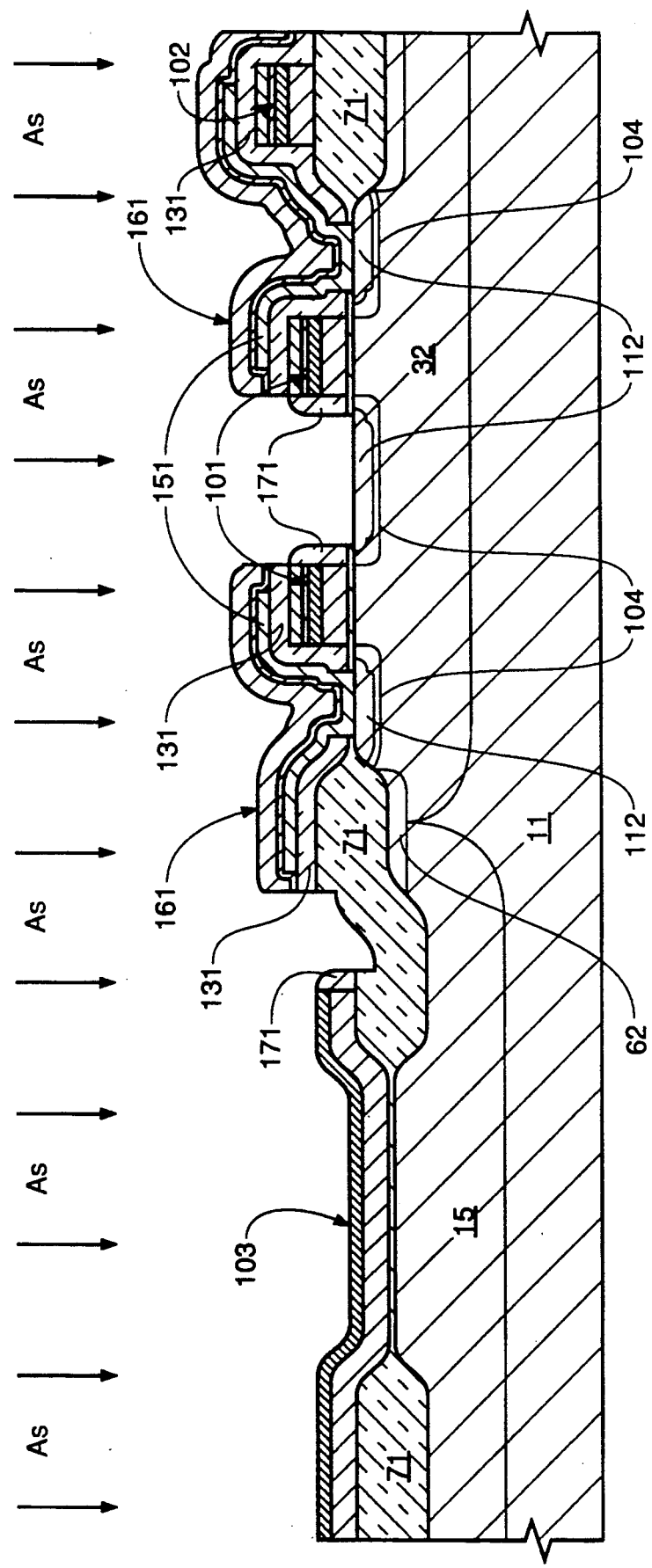
FIG. 17 is a cross-sectional view of the wafer portion of FIG. 16 following an anisotropic oxide spacer etch, a photoresist strip, an unmasked N-channel arsenic source/drain implant, and an optional low-temperature anneal step.

Referring now to FIG. 17, the wafer is subjected to an anisotropic oxide etch, which, in the cell array region of the chip, creates a wide spacer 171 on the bitline side of transistor gate 101. The transistor side of cell access transistor gate 101 is protected from the anisotropic etch by the overlying cell plate 152. In the periphery of the device, spacers are formed on both sides of N-channel transistor gates (not shown) and on the edges of the expanse of silicided polysilicon 103. Once the spacer etch is complete, eighth photomask 154 is stripped, and a blanket N-channel N+ source/drain implant (preferably with arsenic) is performed without the need of a mask, since the P-channel devices are still completely protected by the unetched expanse polysilicon 103. This fact is a major benefit of the split polysilicon process. Also, the process eliminates the N-channel source/drain arsenic implant from the storage-node side of the access gate, resulting in improved refresh by preventing degradation which could result from crystal damage due to the heavy N-channel arsenic source/drain implant in the storage-node contact regions of each cell. A low-temperature anneal step (approximately 600° C.) may be performed at this point in the process in order to improve the etch characteristics of the expanse of dielectric-coated, silicided poly 103. It will be noted that a lightly-doped-drain (LDD) has been created on the bitline side of cell access transistor 101 as a result of the different offsets used for the phosphorus and arsenic source/drain implants.

Figure 18:
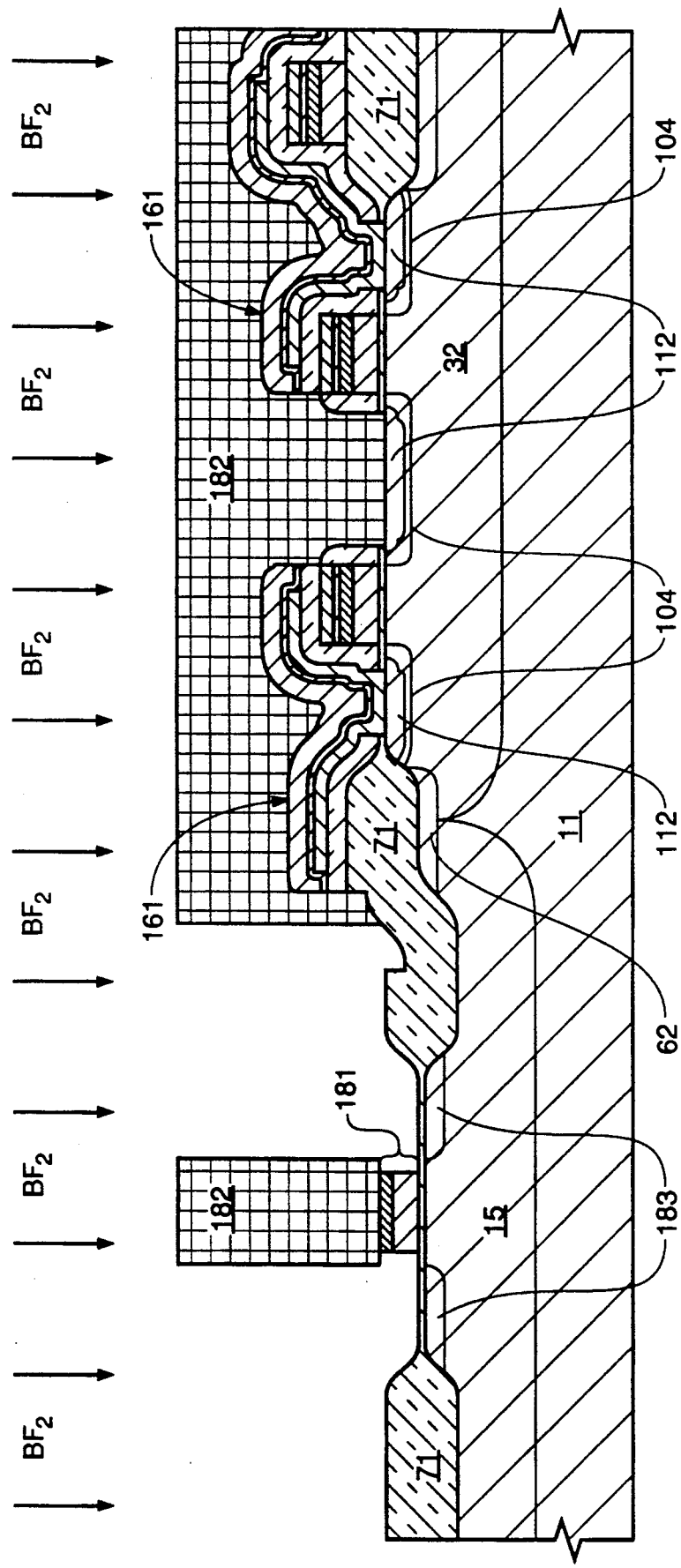
FIG. 18 is a cross-sectional view of the wafer portion of FIG. 17 following a ninth photomasking step, an undercutting etch step, and a P-channel source/drain implant (preferably with either boron-difluoride or boron)
Figure 19:
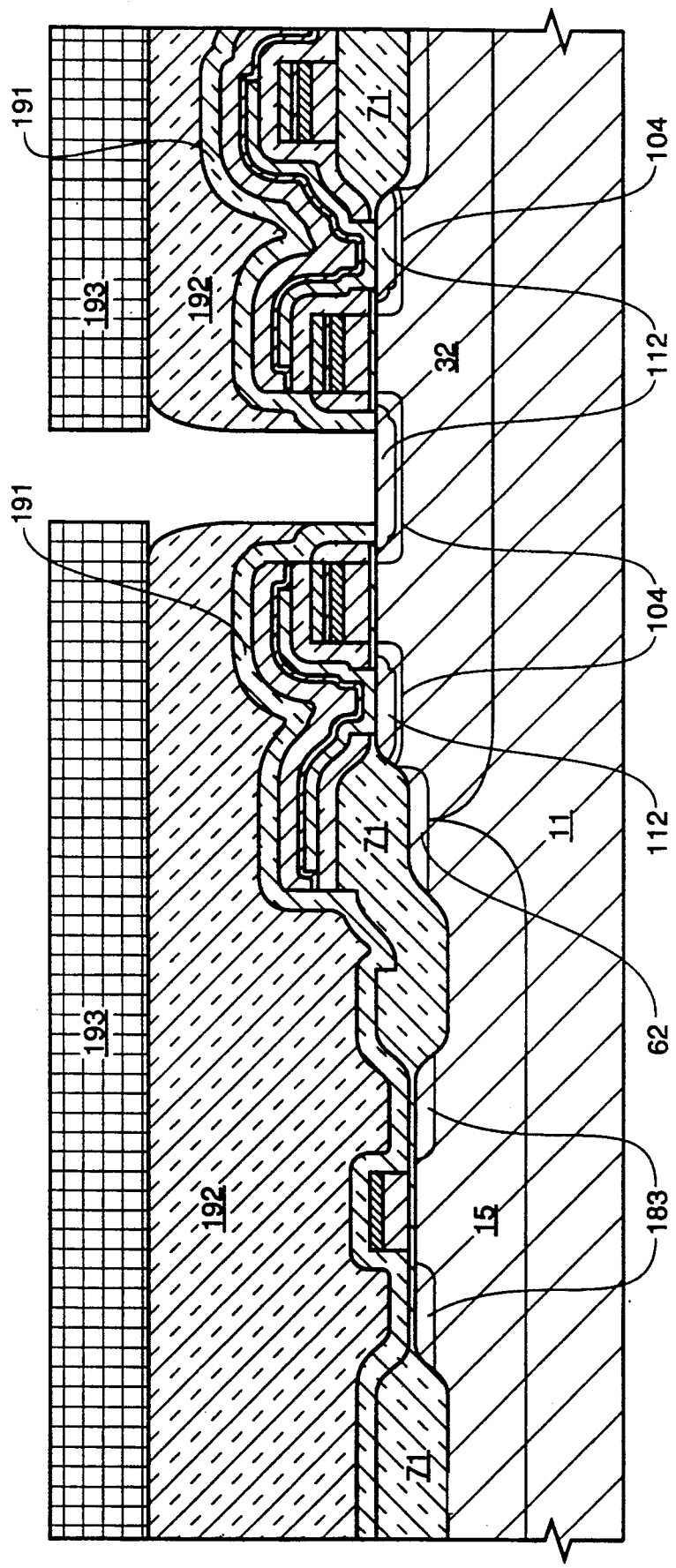
FIG. 19 is a cross-sectional view of the wafer portion of FIG. 18 following a photoresist strip, deposition of a BPSG layer, creation of a tenth photomask which defines bitline contacts, and an anisotropic etch.

Referring now to FIG. 18, following the completion of N-channel device formation, P-channel polysilicon gates 181 are patterned with a ninth photoresist mask 182, and then etched. A P-channel source/drain implant (preferably with either boron-difluoride or boron) is performed with resist mask 182 in place over the P-channel devices. A special undercut etch is employed to reduce the amount of overlap capacitance between the P-channel polysilicon gates 181 and the P-channel source/drain diffusion regions 183. Patterning of the P-channel devices is done in such a way that the N-channel device regions are completely covered with resist during the P-channel source/drain implant thus allowing implantation of P-channel source/drains to occur without having to employ an additional masking step to protect the N-channel device regions therefrom. The resist used to pattern the P-channel devices is removed after the P-channel implant is performed.

Referring now to FIG. 99, a photoresist strip has removed photomask 182, subsequent to which an interlayer dielectric layer, comprised of a conformal TEOS silicon dioxide layer 191, and a planarized boro-phospho-silicate glass (BPSG) layer 192, is blanket deposited over the surface of the wafer. A tenth photomask 193, which defines bitline contacts, is then created on top of BPSG layer 192. A subsequent anisotropic etch exposes bitline contacts 193.

Figure 20:
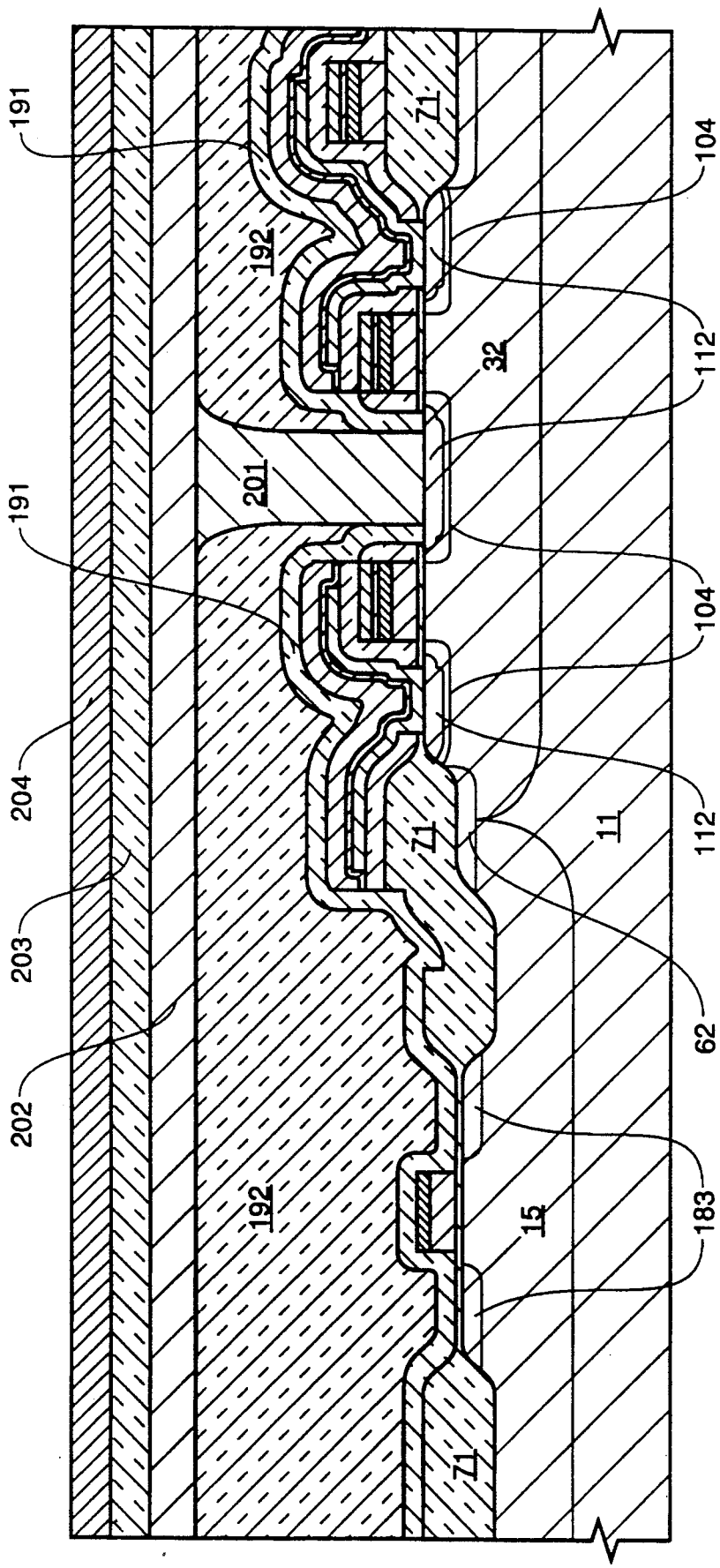
FIG. 20 is a cross-sectional view of the wafer portion of FIG. 19 following a photoresist strip, the optional deposition and planarization of an appropriate plug filler material, deposition of a metal layer, patterning of the metal layer to create bitlines, and deposition of multiple passivation layers.

Referring now to FIG. 20, following a photoresist strip which removes, photomask 192, a plug filler material, such as tungsten which has exceptionally good conformal deposition characteristics, is blanket deposited over the surface of the wafer. The filler material layer is then planarized using one of several techniques (e.g., a planarizing etchback) in order to create filler plug 201. A layer of a low-resistance metal, such as aluminum, is then deposited and patterned with an eleventh photomask (not shown), which defines bitlines. Following an anisotropic etch, which creates bitlines 202 and other chip interconnects (not shown), a silicon dioxide passivation layer 203 is deposited. This is followed by the deposition of a silicon nitride passivation layer 204. A twelfth photomask (also not shown), is utilized to expose bonding pads (also not shown) through passivation layers 203 and 204 so that electrical connections can be made to the chip.

Although only a single embodiment of the twelve-mask CMOS process for fabricating a dynamic random access memory having stacked-capacitor cells, it will be apparent to those having ordinary skill in the art of semiconductor manufacture, that modifications and changes may be made thereto without departing from the scope and the spirit of the process as hereinafter claimed.

We claim:

1. A split-polysilicon CMOS DRAM process incorporating stacked-capacitor cells, said process commencing with a lightly-doped P-type wafer, and comprising the following sequence of steps:

(a) creating N-well regions within certain portions of the wafer;
   (b) creating P-well regions within other portions of the wafer;
   (c) creating channel-stop regions within portions of the wafer above which field oxide regions will be created;
   (d) creating said field oxide regions;
   (e) depositing a first polysilicon layer on the surface of the wafer;
   (f) doping said first polysilicon layer in order to render it conductive;
   (g) patterning N-channel FET gates and N-channel interconnects from said first polysilicon layer and creating an unetched expanse of a portion of said first polysilicon layer in P-channel regions;
   (h) depositing a first silicon dioxide spacer layer over the surface of the wafer;
   (i) performing an unmasked lightly-doped source/drain implant with phosphorus;
   (j) depositing a second silicon dioxide spacer layer;
   (k) performing a masking step which exposes said second spacer layer superjacent storage-node contact regions;
   (l) performing an anisotropic etch which exposes the storage-node contact regions;
   (m) deposition of a second polysilicon layer over the surface of the wafer;
   (n) doping said second polysilicon layer in order to render it conductive;
   (o) patterning of individual storage-node plates from said second polysilicon layer;
   (p) depositing a capacitor dielectric layer over the surface of the wafer;
   (q) depositing a third polysilicon layer over the surface of the wafer;
   (r) doping said third polysilicon layer in order to render it conductive;
   (s) patterning said third polysilicon layer to create a cell plate;
   (t) performing an anisotropic oxide spacer etch, which creates spacers from said first and second spacer layers on the edges of the N-channel FET gates on either side of the bitline contact regions, and also exposes the bitline contact regions;
   (u) performing an unmasked N+ source/drain implant;
   (v) patterning P-channel transistors and P-channel interconnects from the unetched expanse of said first polysilicon layer using a mask which defines P-channel gates and interconnects and blankets the N-channel regions;
   (w) performing a P-channel source/drain implant prior to the removal of the mask used to pattern P-channel gates and interconnects;
   (x) depositing an interlayer dielectric layer;
   (y) performing a masking step which exposes portions of the interlayer dielectric layer superjacent bitline contact regions;
   (z) opening bitline contact with an anisotropic etch;
   (aa) creation of bitlines; and
   (bb) depositing at least one passivation layer.

2. The split-polysilicon CMOS DRAM process of claim 1, wherein an optional unmasked halo implant is performed between steps (g) and (h).

3. The split-polysilicon CMOS DRAM process of claim 1, wherein an optional silicon dioxide densification step is performed between steps (j) and (k).

4. The split-polysilicon CMOS DRAM process of claim 1, wherein an optional "high-C" implant is performed between steps (l) and (m).

5. The split-polysilicon CMOS DRAM process of claim 1, wherein the N-channel N+ source/drain implant is performed using arsenic.

6. The split-polysilicon CMOS DRAM process of claim 1, wherein an optional anneal step is performed at approximately 600° C. between steps u and v.

7. The split-polysilicon CMOS DRAM process of claim 1, wherein an optional threshold voltage enhancement implant is performed between steps (d) and (e).

8. The split-polysilicon CMOS DRAM process of claim 1, wherein the patterning of said third polysilicon layer in step (s) is performed with a photoresist masking step, followed by an etch step.

9. The split-polysilicon CMOS DRAM process of claim 8, wherein the anisotropic oxide spacer etch of step (t) is performed with the mask utilized for step (s) in place.

10. A split-polysilicon CMOS DRAM process incorporating stacked-capacitor cells, said process commencing with a lightly-doped P-type wafer, and comprising the following sequence of steps:
(a) creating N-well regions within certain portions of the wafer;
(b) creating P-well regions within outer portions of the wafer;
(c) creating channel-stop regions within portions of the wafer above which device isolation regions will be created;
(d) creating said device isolation regions;
(e) creating a first conductive layer, which blankets the wafer's surface;
(f) patterning N-channel FET gates and N-channel interconnects from said first conductive layer and creating an expanse of unetched first conductive layer material in P-channel regions;
(g) depositing at least one dielectric spacer layer, which blankets the wafer's surface;
(h) performing a masking step which exposes portions of the spacer layer superjacent storage-node contact regions;
(i) performing an anisotropic etch which exposes the storage-node contact regions;
(j) creating a second conductive layer, which blankets the wafer's surface;
(k) patterning individual storage-node plates from said second polysilicon layer;
(l) creating a capacitor dielectric layer;
(m) creating a third conductive layer;
(n) patterning the third conductive layer to create a cell plate;
(o) performing an anisotropic oxide spacer etch, which creates spacers from said first and second dielectric spacer layers on the edges of the N-channel FET gates on either side of the bitline contact regions, and also exposes the bitline contact regions;
(p) performing an unmasked N+ source/drain implant;
(q) patterning P-channel FET gates and P-channel interconnects from the unetched expanse of said first conductive layer using a mask which defines P-channel gates and interconnects and blankets the N-channel regions;

(r) performing a P-channel source/drain implant prior to the removal of the photoresist mask used to pattern P-channel gates and interconnects;
(s) depositing an interlayer dielectric layer;
(t) performing a masking step which exposes portions of the interlayer dielectric lay superjacent bitline contact regions;
(u) creating bitline contact openings with an anisotropic etch;
(v) creation of bitlines; and
(w) deposition of at least one passivation layer.

11. The split-polysilicon CMOS DRAM process of claim 10, wherein an optional threshold voltage enhancement implant is performed between steps (d) and (e).

12. The split-polysilicon CMOS DRAM process of claim 10, wherein said first conductive layer is comprised of a lower layer of doped polysilicon and an upper layer of refractory metal silicide.

13. The split-polysilicon CMOS DRAM process of claim 12, which further comprises the steps of depositing a silicon dioxide capping layer on top of said refractory metal silicide layer, and depositing a silicon nitride capping layer on top of said silicon dioxide capping layer, then patterning said first conductive layer, said refractory metal silicide layer, and both capping layers in one step during N-channel FET gates and interconnect patterning.

14. The split-polysilicon CMOS DRAM process of claim 10, wherein an optional unmasked halo implant is performed between steps (g) and (h).

15. The split-polysilicon CMOS DRAM process of claim 10, wherein an optional unmasked phosphorus lightly-doped source/drain implant is performed between steps (h) and (i).

16. The split-polysilicon CMOS DRAM process of claim 15, wherein a second dielectric spacer layer is deposited immediately following the lightly-doped source/drain implant.

17. The split-polysilicon CMOS DRAM process of claim 16, wherein an optional oxide densification step is performed immediately following the deposition of said second dielectric spacer layer.

18. The split-polysilicon CMOS DRAM process of claim 10, wherein an optional "high-C" implant is performed between steps (i) and (j).

19. The split-polysilicon CMOS DRAM process of claim 10, wherein an optional anneal step is performed at approximately 600° C. between steps (p) and (q).

20. The split-polysilicon CMOS DRAM process of claim 10, wherein said bitlines are created by the following sequence of steps:
(a) conformally depositing a refractory metal layer on the surface of the wafer, to the extent that it fills said bitline contact openings;
(b) planarizing the wafer so as to leave refractory metal plugs within the bitline contact openings;
(c) depositing a metal layer, which blankets the wafer's surface; and
(d) patterning said metal layer to create bitlines.

21. The split-polysilicon CMOS DRAM process of claim 10, wherein said second and third conductive layers are doped polysilicon.

22. The split-polysilicon CMOS DRAM process of claim 10, wherein step (w) comprises the steps of depositing a silicon dioxide passivation layer, following by the subsequent depositing of a silicon nitride passivation layer.

23. The split-polysilicon CMOS DRAM process of claim 10, wherein P-channel transistor gates and interconnects are undercut beneath the mask used to pattern them with an anisotropic etch having an isotropic component.

* * * * *